United States Patent
Choi

(10) Patent No.: US 8,912,659 B2
(45) Date of Patent: Dec. 16, 2014

(54) STACKED SEMICONDUCTOR PACKAGE AND METHOD FOR MANUFACTURING THE SAME

(71) Applicant: SK Hynix Inc., Icheon-si Gyeonggi-do (KR)

(72) Inventor: Hyeong Seok Choi, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 13/693,678

(22) Filed: Dec. 4, 2012

(65) Prior Publication Data
US 2013/0292845 A1 Nov. 7, 2013

(30) Foreign Application Priority Data
May 3, 2012 (KR) .......................... 10-2012-0047065

(51) Int. Cl.
| | |
|---|---|
| H01L 23/48 | (2006.01) |
| H01L 23/52 | (2006.01) |
| H01L 29/40 | (2006.01) |
| H01L 21/768 | (2006.01) |
| H01L 23/31 | (2006.01) |
| H01L 25/065 | (2006.01) |
| H01L 21/78 | (2006.01) |
| H01L 25/10 | (2006.01) |
| H01L 25/00 | (2006.01) |
| H01L 23/498 | (2006.01) |

(52) U.S. Cl.
CPC ... *H01L 23/49827* (2013.01); *H01L 2225/1058* (2013.01); *H01L 21/76898* (2013.01); *H01L 2924/15311* (2013.01); *H01L 23/3114* (2013.01); *H01L 2225/06513* (2013.01); *H01L 2224/16145* (2013.01); *H01L 25/0657* (2013.01); *H01L 21/78* (2013.01); *H01L 25/105* (2013.01); *H01L 2225/06541* (2013.01); *H01L 2224/48227* (2013.01); *H01L 2225/06517* (2013.01); *H01L 2225/1011* (2013.01); *H01L 23/3128* (2013.01); *H01L 2224/48091* (2013.01); *H01L 25/50* (2013.01)

USPC .... 257/774; 257/678; 257/734; 257/E21.061; 257/E21.062; 257/E21.499; 257/E21.502; 257/E21.503; 257/E21.508; 257/E21.509; 257/E21.511

(58) Field of Classification Search
USPC ......... 257/774, 678, 734, 686, 777, 780, 772, 257/781, 787, 735, E21.061, E21.062, 257/E21.499, E21.502, E21.503, E21.508, 257/E21.509, E21.511
See application file for complete search history.

(56) References Cited

U.S. PATENT DOCUMENTS

| | | | | |
|---|---|---|---|---|
| 6,798,049 | B1 * | 9/2004 | Shin et al. | 257/678 |
| 7,061,120 | B2 * | 6/2006 | Shin et al. | 257/777 |
| 8,299,591 | B2 * | 10/2012 | Oh et al. | 257/686 |
| 8,508,954 | B2 * | 8/2013 | Kwon et al. | 361/790 |

* cited by examiner

*Primary Examiner* — David Nhu
(74) *Attorney, Agent, or Firm* — William Park & Associates Patent Ltd.

(57) ABSTRACT

A stacked semiconductor package includes a first semiconductor chip having a first surface and a second surface which faces away from the first surface and including first bonding pads which are formed on the first surface and first through electrodes which pass through the first surface and the second surface; a second semiconductor chip stacked over the second surface of the first semiconductor chip, and including second bonding pads which are formed on a third surface facing the first semiconductor chip and second through electrodes which pass through the third surface and a fourth surface facing away from the third surface and are electrically connected with the first through electrodes; and a molding part formed to substantially cover the stacked first and second semiconductor chips and having openings which expose one end of the first through electrodes disposed on the first surface of the first semiconductor chip.

9 Claims, 10 Drawing Sheets

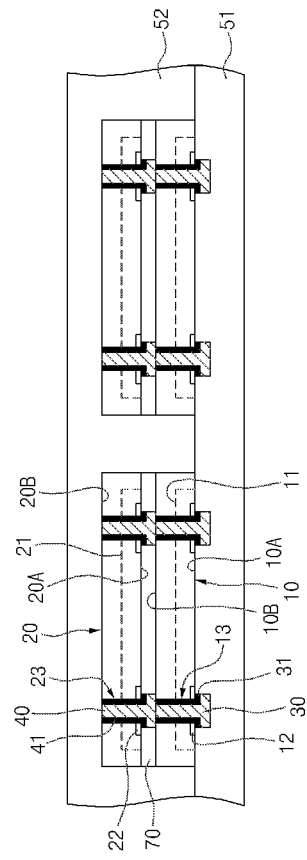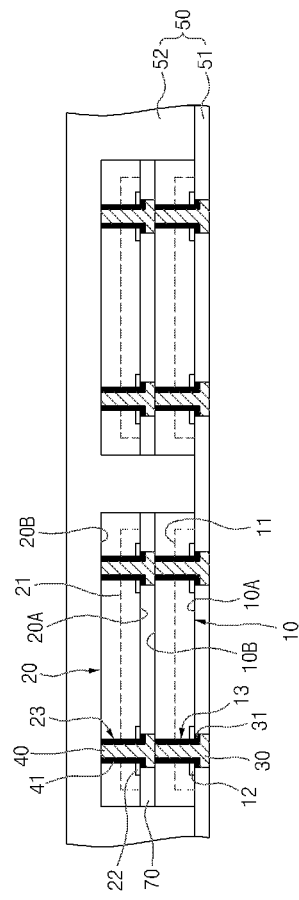

STACKED SEMICONDUCTOR PACKAGE AND METHOD FOR MANUFACTURING THE SAME

CROSS-REFERENCE TO RELATED APPLICATIONS

The present application claims priority to Korean Patent Application Number 10-2012-0047065 filed in the Korean Intellectual Property Office on May 3, 2012, which is incorporated herein by reference in its entirety.

BACKGROUND

1. Field of the Invention

The present invention generally relates to a semiconductor device, and more particularly, to a stacked semiconductor package which has a structure suitable for improving the manufacturing yield and a method for manufacturing the same.

2. Description of the Related Art

In the semiconductor industry, packaging technologies for integrated circuits have continuously been developed to satisfy the demand toward miniaturization and mounting reliability. Recently, as miniaturization and high performance are demanded in electric and electronic appliances, various stacking techniques have been developed.

The term "stack" that is referred to in the semiconductor industry means to vertically pile at least two semiconductor chips or semiconductor packages. In the case of a memory device, by using a stacking technology, it is possible to realize a product having memory capacity at least two times greater than that obtainable through semiconductor integration processes. Since stacked semiconductor packages have advantages in terms of not only memory capacity but also mounting density and mounting area utilization efficiency, research and development for stacked semiconductor packages have been accelerated.

As an example of a stacked semiconductor package, a structure has been proposed, in which through electrodes are formed in semiconductor chips so that upper and lower semiconductor chips are physically and electrically connected with one another by the through electrodes. The manufacturing procedure of such stacked semiconductor package using through electrodes is as follows.

Holes are defined at desired positions of respective semiconductor chips through an etching process at a wafer level, and through electrodes are formed in the holes using a metallic substance through a plating process. Thereafter, with a carrier substrate attached to the front surface of a wafer, the through electrodes are exposed by back-grinding the back surface of the wafer. After detaching the carrier substrate, the semiconductor chips of the wafer are individualized by sawing the wafer. Then, by stacking at least two of the individualized semiconductor chips on a substrate having circuit patterns by using the through electrodes, a stacked semiconductor package is formed.

In the stacked semiconductor package using through electrodes, since electrical connections are formed through the through electrodes, advantages are provided in that it is possible to achieve a high operation speed and miniaturization.

However, because the semiconductor chips are stacked in the state in which they are grinded thin through the back-grinding process, warping is likely to occur in the semiconductor chips so that stacking is difficult to conduct, and a crack is likely to occur in the semiconductor chips so that the manufacturing yield of the stacked semiconductor package decreases.

SUMMARY

An embodiment is directed to a stacked semiconductor package which has a structure for improving the manufacturing yield by preventing the occurrence of a warpage and a crack.

Also, an embodiment is directed to a method for manufacturing the stacked semiconductor package.

In an embodiment, a stacked semiconductor package includes: a first semiconductor chip having a first surface and a second surface which faces away from the first surface and including first bonding pads which are formed on the first surface and first through electrodes which pass through the first surface and the second surface; a second semiconductor chip stacked over the second surface of the first semiconductor chip, and including second bonding pads which are formed on a third surface facing the first semiconductor chip and second through electrodes which pass through the third surface and a fourth surface facing away from the third surface and are electrically connected with the first through electrodes; and a molding part formed to substantially cover the stacked first and second semiconductor chips and having openings which expose one end of the first through electrodes disposed on the first surface of the first semiconductor chip.

The molding part may include: a first molding part substantially covering the first surface of the first semiconductor chip and having the openings which expose the one end of the first through electrodes; and a second molding part formed to substantially cover the fourth surface of the second semiconductor chip and side surfaces of the first and second semiconductor chips. The molding part may include an epoxy molding compound.

The stacked semiconductor package may further include: conductive connection members formed between the first through electrodes and the second through electrodes; and an adhesive member formed between the first semiconductor chip and the second semiconductor chip. The conductive connection members may comprise of solder pastes and the adhesive member comprises a non-conductive paste. Unlike this, the stacked semiconductor package may further include anisotropic conductive material interposed between the first through electrodes and the second through electrodes and between the first semiconductor chip and the second semiconductor chip.

The stacked semiconductor package may further include external connection terminals mounted to the one end of the first through electrodes which are exposed through the molding part. The molding part may include an epoxy molding compound.

The stacked semiconductor package may further include: redistribution lines formed over the molding part and electrically connected with the one end of the first through electrodes exposed through the molding part; an insulation layer formed over the molding part including the redistribution lines and exposing portions of the redistribution lines; and external connection terminals mounted to the portions of the redistribution lines exposed through the insulation layer. The external connection terminals may comprise of solder balls.

Additionally, the stacked semiconductor package may further include a structural body having connection electrodes which are electrically connected with the one end of the first through electrodes exposed through the molding part. The stacked semiconductor package may further comprise conductive connection members electrically connecting the one end of the first through electrodes with the connection electrodes. The structural body includes a substrate having an upper surface, and the structural body comprises a semiconductor package. The stacked semiconductor package may further comprise a semiconductor chip mounted to the upper surface of the substrate between the connection electrodes, the semiconductor chip being fixed to the upper surface by a molding part, and the semiconductor chip is electrically connected to the substrate through wires. The structural body may include any one of a printed circuit board, an interposer and a semiconductor package.

In an embodiment, a method for manufacturing a stacked semiconductor package includes: forming first through electrodes in a first wafer which is formed with a plurality of first semiconductor chips each having first bonding pads, to pass through first surfaces of the first semiconductor chips on which the first bonding pads are disposed; forming a first molding part on the first wafer to cover the first surfaces of the first semiconductor chips; exposing the first through electrodes on second surfaces of the first semiconductor chips which face away from the first surfaces; stacking a second wafer including a plurality of second semiconductor chips each having second bonding pads and formed with second through electrodes to a depth that passes through third surfaces on which the second bonding pads are disposed and does not reach fourth surfaces which face away from the third surfaces, over the first wafer such that the second through electrodes are electrically connected with the first through electrodes; exposing the second through electrodes on the fourth surfaces of the second semiconductor chips; individualizing the first and second semiconductor chips; forming a second molding part on the first molding part including the stacked first and second semiconductor chips; and partially removing the first molding part to expose one end of the first through electrodes. The first and second molding parts may be formed as an epoxy molding compound.

The stacking of the second wafer over the first wafer may be implemented in such a way as to attach the first wafer and the second wafer to each other by the medium of conductive connection members which are interposed between the first through electrodes and the second through electrodes and an adhesive member which is interposed between the first wafer and the second wafer. The conductive connection members may comprise of solder pastes, and the adhesive member comprise a non-conductive paste.

Additionally, the stacking of the second wafer over the first wafer may be implemented in such a way as to attach the first wafer and the second wafer to each other by the medium of an anisotropic conductive film which is interposed between the first through electrodes and the second through electrodes and between the first wafer and the second wafer.

The exposing of the first through electrodes on the second surfaces of the first semiconductor chips may be implemented in such a way as to etch a back surface of the first wafer corresponding to the second surfaces of the first semiconductor chips to expose the first through electrodes on the second surfaces of the first semiconductor chips.

The exposing of the second through electrodes on the fourth surfaces of the second semiconductor chips may be implemented in such a way as to etch a back surface of the second wafer corresponding to the fourth surfaces of the second semiconductor chips to expose the second through electrodes on the fourth surfaces of the second semiconductor chips.

The partially removing of the first molding part to expose the one end of the first through electrodes may be implemented in such a way as to etch the first molding part such that the one end of the first through electrodes are exposed.

After the exposing of the one end of the first through electrodes, the method may further include: mounting external connection terminals to the one end of the first through electrodes which are exposed through the first molding part; and cutting the first and second molding parts and individualizing semiconductor packages.

After the exposing of the one end of the first through electrodes, the method may further include: cutting the first and second molding parts and individualizing semiconductor packages; and mounting an individualized semiconductor package to a structural body such that the one end of the first through electrodes which are exposed through the first molding part are electrically connected with connection electrodes of the structural body. The structural body may include any one of a printed circuit board, an interposer and a semiconductor package. The cutting of the first and second molding parts may be performed using a diamond blade or a laser cutting apparatus.

After the exposing of the one end of the first through electrodes, the method may further include: forming redistribution lines over the first molding part to be electrically connected with the one end of the first through electrodes which are exposed through the first molding part; forming an insulation layer over the first molding part including the redistribution lines to expose portions of the redistribution lines; and cutting the first and second molding parts and the insulation layer and individualizing semiconductor packages.

BRIEF DESCRIPTION OF THE DRAWINGS

FIGS. 6A to 6J are cross-sectional views illustrating the processes of a method for manufacturing the stacked semiconductor package in accordance with various embodiments.

DETAILED DESCRIPTION

Figure 1:
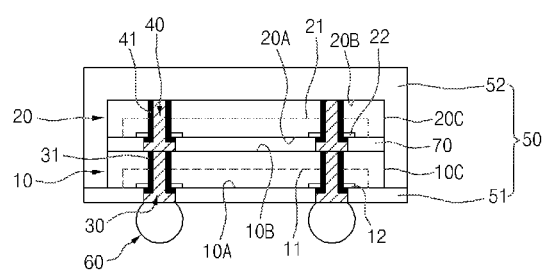
FIG. 1 is a cross-sectional view illustrating a stacked semiconductor package in accordance with an embodiment.

Hereafter, various embodiments will be described in detail with reference to the accompanying drawings. Additionally, the same reference numerals or the same reference designators denote the same elements throughout the specification.

It is to be understood herein that the drawings are not necessarily to scale and in some instances proportions may have been exaggerated in order to more clearly depict certain features of the invention.

FIG. 1 is a cross-sectional view illustrating a stacked semiconductor package in accordance with an embodiment.

Referring to FIG. 1, a stacked semiconductor package in accordance with an embodiment may include first and second semiconductor chips 10 and 20 and a molding part 50. Also, the stacked semiconductor package may further include external connection terminals 60.

The first semiconductor chip 10 has a first surface 10A, a second surface 10B which faces away from the first surface 10A, and side surfaces 10C which connect the first surface 10A and the second surface 10B. The first semiconductor chip 10 may include a first circuit block 11, first bonding pads 12, and first through electrodes 30.

The first circuit block 11 may include elements such as transistors, capacitors, resistors, etc. for storing and processing data. The first bonding pads 12 as electrical contacts of the first circuit block 11 for connection to an outside may be formed on the first surface 10A of the first semiconductor chip 10.

The first through electrodes 30 pass through the first surface 10A and the second surface 10B of the first semiconductor chip 10 and may be electrically connected with the first circuit block 11. In an embodiment, the first through electrodes 30 pass through the first bonding pads 12.

In an embodiment, one end of the first through electrodes 30 which are disposed on the first surface 10A of the first semiconductor chip 10 project from the first surface 10A of the first semiconductor chip 10 by a predetermined height, and the other ends of the first through electrodes 30 which are disposed on the second surface 10B of the first semiconductor chip 10 are substantially flush with the second surface 10B of the first semiconductor chip 10. A first seed layer 31 may be additionally formed between the first through electrodes 30 and the first semiconductor chip 10.

The second semiconductor chip 20 is stacked on the second surface 10B of the first semiconductor chip 10.

The second semiconductor chip 20 has a third surface 20A which faces the second surface 10B of the first semiconductor chip 10, a fourth surface 20B which faces away from the third surface 20A, and side surfaces 20C which connect the third surface 20A and the fourth surface 20B. The second semiconductor chip 20 may include a second circuit block 21, second bonding pads 22, and second through electrodes 40.

The second circuit block 21 may include elements such as transistors, capacitors, resistors, etc. for storing and processing data. The second bonding pads 22 act as electrical contacts of the second circuit block 21 for connection to an outside and may be formed on the third surface 20A of the second semiconductor chip 20.

The second through electrodes 40 pass through the third surface 20A and the fourth surface 20B of the second semiconductor chip 20 and may be electrically connected with the second circuit block 21. In an embodiment, the second through electrodes 40 pass through the second bonding pads 22.

One end of the second through electrodes 40 which are disposed on the third surface 20A of the second semiconductor chip 20 project from the third surface 20A of the second semiconductor chip 20 by a predetermined height and may be electrically connected with the other ends of the first through electrodes 30, and the other ends of the second through electrodes 40 which are disposed on the fourth surface 20B of the second semiconductor chip 20 and are substantially flush with the fourth surface 20B of the second semiconductor chip 20. A second seed layer 41 may be additionally formed between the second through electrodes 40 and the second semiconductor chip 20.

Conductive connection members (not shown) such as solder pastes may be formed between the first through electrodes 30 and the second through electrodes 40 to electrically connect the first through electrodes 30 and the second through electrodes 40 with each other. An adhesive member 70 such as a non-conductive paste is formed between the first semiconductor chip 10 and the second semiconductor chip 20 to attach the first semiconductor chip 10 and the second semiconductor chip 20 to each other. Instead of the conductive connection members and the non-conductive paste, an anisotropic conductive material may be formed between the first semiconductor chip 10 and the second semiconductor chip 20 and between the first through electrodes 30 and the second through electrodes 40 to attach the first semiconductor chip 10 and the second semiconductor chip 20 to each other and electrically connect the first through electrodes 30 and the second through electrodes 40 with each other.

The molding part 50 may include a first molding part 51 and a second molding part 52.

The first molding part 51 is formed to substantially cover the first surface 10A of the first semiconductor chip 10 and has openings which expose the one end of the first through electrodes 30. The second molding part 52 is formed to substantially cover the fourth surface 20B of the second semiconductor chip 20 and the side surfaces 10C and 20C of the first and second semiconductor chips 10 and 20. The molding part 50 may include an epoxy molding compound (EMC).

The external connection terminals 60 are mounted to the one end of the first through electrodes 30 which are exposed through the molding part 50. In an embodiment, the external connection terminals 60 may be formed as solder balls.

Figure 2:
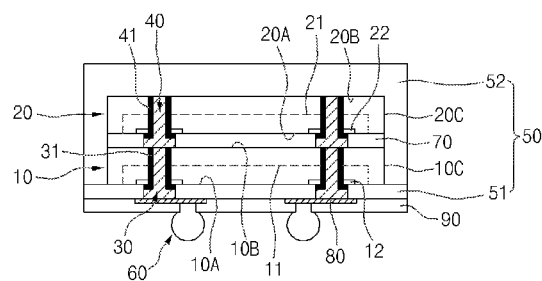
FIG. 2 is a cross-sectional view illustrating a stacked semiconductor package in accordance with an embodiment.

FIG. 2 is a cross-sectional view illustrating a stacked semiconductor package in accordance with an embodiment.

Referring to FIG. 2, unlike an embodiment associated with FIG. 1 which may include the external connection terminals 60 mounted to the one end of the first through electrodes 30 exposed through the molding part 50, a stacked semiconductor package in accordance with an embodiment associated with FIG. 2 may include redistribution lines 80 which may be electrically connected with one end of first through electrodes 30 exposed through a molding part 50, an insulation layer 90 which is formed on the molding part 50 including the redistribution lines 80 and exposes portions of the redistribution lines 80, and external connection terminals 60 which are mounted to the portions of the redistribution lines 80 exposed through the insulation layer 90. The external connection terminals 60 include solder balls.

Figure 3:
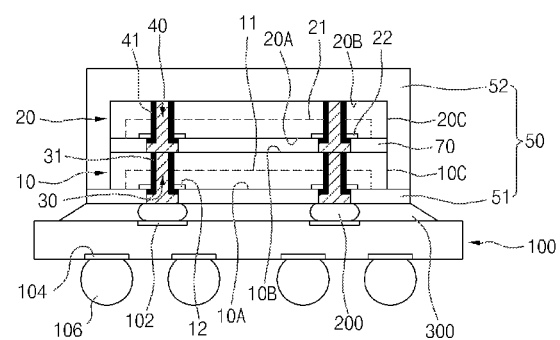
FIG. 3 is a cross-sectional view illustrating a stacked semiconductor package in accordance with an embodiment.

FIG. 3 is a cross-sectional view illustrating a stacked semiconductor package in accordance with an embodiment.

Referring to FIG. 3, unlike the embodiments associated with FIG. 1 which may include the external connection terminals 60 mounted to the one end of the first through electrodes 30 exposed through the molding part 50, a stacked semiconductor package in accordance with an embodiment associated with FIG. 3 may include a structural body 100 having connection electrodes 102 which may be electrically connected with one end of first through electrodes 30 exposed through a molding part 50. In an embodiment associated with FIG. 3, the structural body 100 is constituted by a printed circuit board (PCB).

The first through electrodes 30 and the connection electrodes 102 of the structural body 100 may be electrically connected with each other by conductive connection members 200. An adhesive member 300 is formed between the molding part 50 and the structural body 100. In FIG. 3, the reference numeral 104 may designate ball lands, and external connection terminals 106 mounted to the ball lands 104.

While it was illustrated in these embodiments described above with reference to FIG. 3 that the structural body 100 is constituted by a printed circuit board, the structural body 100 may be constituted by a semiconductor package or an interposer. Such types of stacked semiconductor packages will become more apparent from the following descriptions taken in conjunction with FIGS. 4 and 5.

Figure 4:
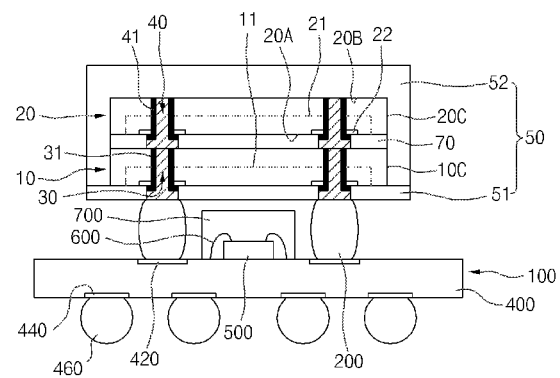
FIG. 4 is a cross-sectional view illustrating a stacked semiconductor package in accordance with an embodiment.

FIG. 4 is a cross-sectional view illustrating a stacked semiconductor package in accordance with an embodiment.

Referring to FIG. 4, unlike the stacked semiconductor package in accordance with the embodiments associated with FIG. 3 in which the structural body 100 is constituted by a printed circuit board, in a stacked semiconductor package in accordance with an embodiment associated with FIG. 4, a structural body 100 is constituted by a semiconductor package.

The semiconductor package may include a substrate 400 which has on the upper surface thereof connection electrodes 420 to be electrically connected with one end of first through electrodes 30 exposed through a molding part 50 and on the lower surface thereof ball lands 440, and a semiconductor chip 500 which is mounted to the upper surface of the substrate 400 between the connection electrodes 420. The semiconductor 500 is electrically connected with the substrate 400 using wires 600 and is fixed by a molding part 700. The reference numeral 460 designates external connection terminals which are mounted to the ball lands 440.

One end of the first through electrodes 30 and the connection electrodes 420 of the structural body 100 may be electrically connected with each other by the medium of conductive connection members 200. In an embodiment, the conductive connection members 200 may be formed as solder balls. Also, the conductive connection members 200 may be formed as lead lines.

Figure 5:
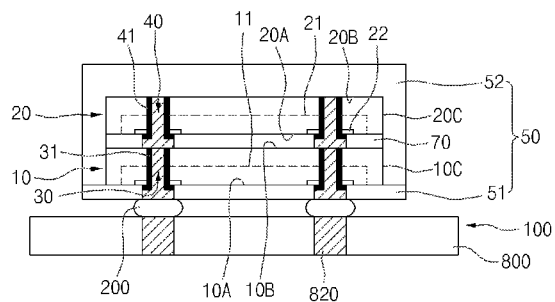
FIG. 5 is a cross-sectional view illustrating a stacked semiconductor package in accordance with an embodiment.

FIG. 5 is a cross-sectional view illustrating a stacked semiconductor package in accordance with an embodiment.

Referring to FIG. 5, unlike the stacked semiconductor package in accordance with the embodiments associated with FIG. 3 in which the structural body 100 is constituted by a printed circuit board, in a stacked semiconductor package in accordance with an embodiment associated with FIG. 5, a structural body 100 is constituted by an interposer.

The interposer may include an interposer body 800 and connection electrodes 820 which pass through the upper surface and the lower surface of the interposer body 800 and may be electrically connected with one end of first through electrodes 30 exposed through a molding part 50. The one end of the first through electrodes 30 and the connection electrodes 820 of the structural body 100 may be electrically connected with each other by conductive connection members 200.

While not shown, after the stacked semiconductor package is mounted to the interposer, the stacked semiconductor package is mounted to another semiconductor structure, for example, a semiconductor package or a main board, by the medium of the interposer.

FIGS. 6A to 6J are cross-sectional views illustrating the processes of a method for manufacturing the stacked semiconductor package in accordance with an embodiment.

Figure 6A:
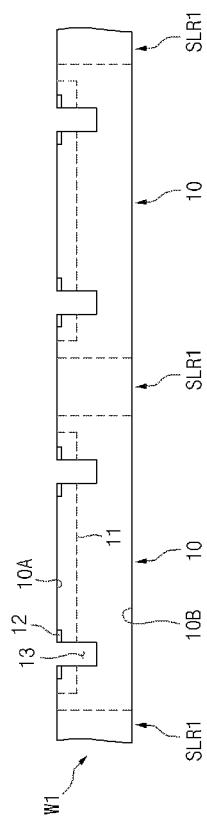

Referring to FIG. 6A, a first wafer W1 having a plurality of first semiconductor chips 10 and a scribe lane region SLR1 which divides the first semiconductor chips 10 is prepared.

A first circuit block 11 and first bonding pads 12 may be formed on a first surface 10A of each of the first semiconductor chips 10 formed on the first wafer W1. The first circuit block 11 may include elements such as transistors, capacitors, resistors, etc. for storing and processing data. The first bonding pads 12 serve electrical contacts of the first circuit block 11 for connection with an outside.

First blind via holes 13 may be defined on the first wafer W1 to pass through the first surface 10A of each of the first semiconductor chips 10. The first blind via holes 13 may be defined to a depth that is larger than the thickness of the first circuit block 11 measured from the first surface 10A of each of the first semiconductor chips 10 and is smaller than the thickness of each of the first semiconductor chips 10.

The first blind via holes 13 may be defined through any one of a drilling process, a laser drilling process and a photolithographic process. In an embodiment, the first blind via holes 13 are defined to pass through the first bonding pads 12. Additionally, the first blind via holes 13 may be defined not to pass through the first bonding pads 12 but to pass through the first circuit block 11.

Figure 6B:
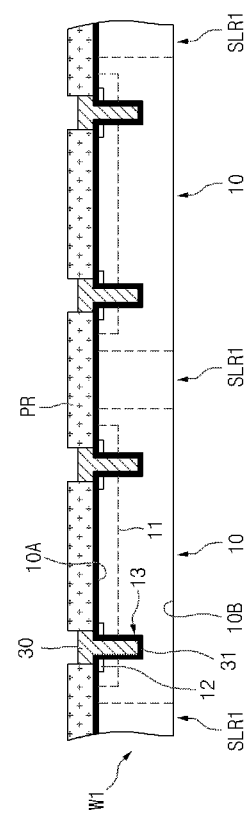

Referring to FIG. 6B, a first seed layer 31 is formed on the first surfaces 10A of the first semiconductor chips 10 and the inner surfaces of the first semiconductor chips 10 which may be formed due to defining of the first blind via holes 13. The first seed layer 31 may be formed through a thin film depositing process such as a CVD (chemical vapor deposition) process.

A photoresist pattern PR is formed on the first seed layer 31 to have openings which expose the first blind via holes 13, and first through electrodes 30 which fill the first blind via holes 13 may be formed on the first seed layer 31 using the photoresist pattern PR as a mask. In an embodiment, the first through electrodes 30 may be formed through a plating process. Additionally, the first through electrodes 30 may be formed through a PVD (physical vapor deposition) process, and the like.

Figure 6C:
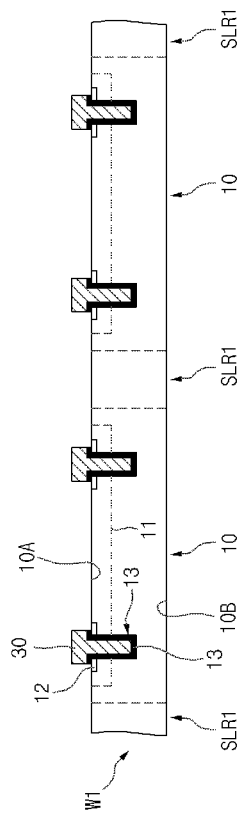

Referring to FIG. 6C, after removing the photoresist pattern PR through an ashing process or a stripping process, the first seed layer 31 which is exposed due to removal of the photoresist pattern PR is removed through an etching process.

Figure 6D:
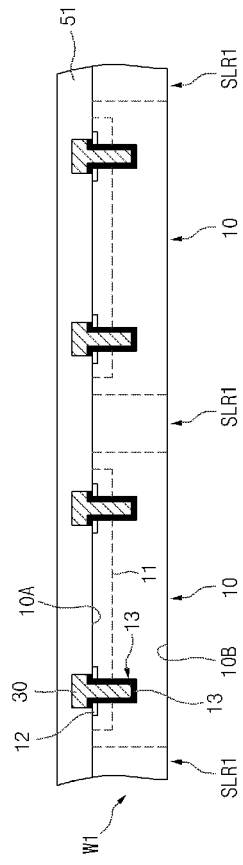

Referring to FIG. 6D, a first molding part 51 is formed on the first wafer W1 to substantially cover the first surfaces 10A of the first semiconductor chips 10. The first molding part 51 may be formed as an epoxy molding compound (EMC).

Figure 6E:
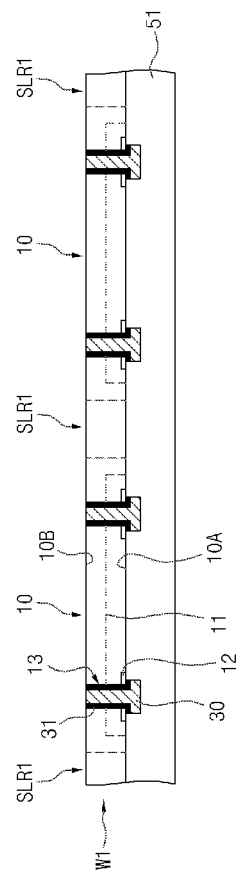

Referring to FIG. 6E, the back surface of the first wafer W1 corresponding to second surfaces 10B of the first semiconductor chips 10 which face away from the first surfaces 10A is grinded through a back-grinding process or is etched through an etch-back process, such that the first through electrodes 30 are exposed on the second surfaces 10B of the first semiconductor chips 10. In this way, the thickness of the first wafer W1 is reduced.

Since the first molding part 51 is formed on the first wafer W1, a warpage or a crack does not occur in the first wafer W1 and in the first semiconductor chips 10 which may be formed on the first wafer W1, even when the thickness of the first wafer W1 is reduced.

Figure 6F:
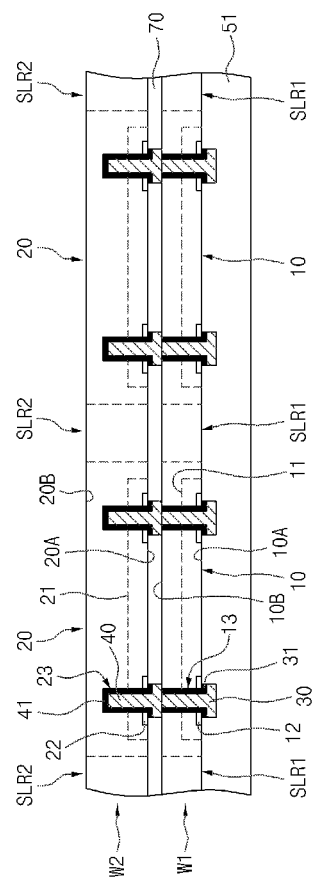

Referring to FIG. 6F, second blind via holes 23 are defined in a second wafer W2 which is formed with a plurality of second semiconductor chips 20 each having second bonding pads 22, to pass through third surfaces 20A of the respective second semiconductor chips 20 on which the second bonding pads 22 are disposed, and second through electrodes 40 may be formed in the second blind via holes 23 with a second seed layer 41 interposed therebetween. The reference symbol SLR2 designates a scribe lane region which is formed between the second semiconductor chips 20.

The second wafer W2 is stacked on the first wafer W1 such that one end of the second through electrodes 40 which are disposed on the third surfaces 20A of the second semiconductor chips 20 may be electrically connected with the ends of the first through electrodes 30 which are exposed on the second surfaces 10B of the first semiconductor chips 10.

In an embodiment, the first wafer W1 and the second wafer W2 are electrically and physically attached to each other by the medium of conductive connection members (not shown) which are interposed between the first through electrodes 30 and the is second through electrodes 40 and an adhesive member 70 which is interposed between the first semiconductor chips 10 and the second semiconductor chips 20. The conductive connection members may include solder pastes, and the adhesive member may include a non-conductive paste. Unlike this, the first wafer W1 and the second wafer W2 may be electrically and physically attached to each other by the medium of an anisotropic conductive material which is interposed between the first through electrodes 30 and the second through electrodes 40 and between the first semiconductor chips 10 and the second semiconductor chips 20.

Figure 6G:
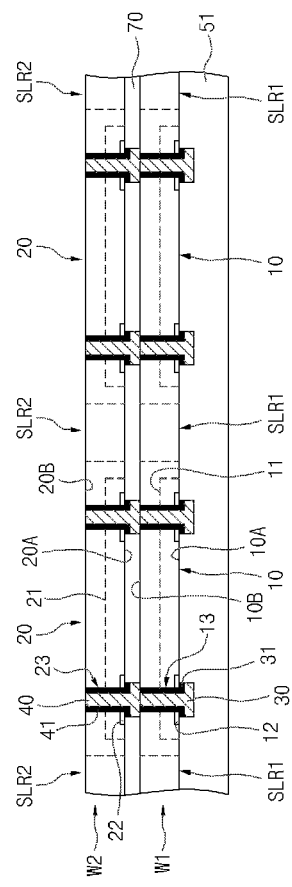

Referring to FIG. 6G, the back surface of the second wafer W2 corresponding to fourth surfaces 20B of the second semiconductor chips 20 is grinded through a back-grinding process or is etched through an etch-back process, such that the second through electrodes 40 are exposed on the fourth surfaces 20B of the second semiconductor chips 20. In this way, the thickness of the second wafer W2 is reduced.

Since the second wafer W2 is attached to the first wafer W1, a warpage or a crack does not occur in the second wafer W2 and in the second semiconductor chips 20 which may be formed on the second wafer W2, even when the thickness of the second wafer W2 is reduced.

Figure 6H:
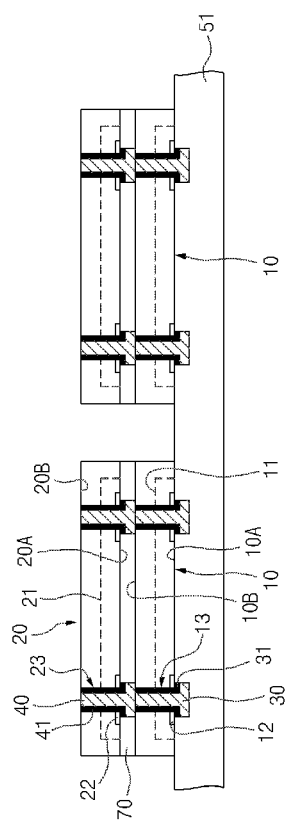

Referring to FIG. 6H, the scribe lane regions SLR1 and SLR2 of the first and second wafers W1 and W2 are cut, individualizing the first and second semiconductor chips 10 and 20.

Referring to FIG. 6I, a second molding part 52 is formed on the first molding part 51 including the stacked first and second semiconductor chips 10 and 20. The second molding part 52 may be formed as an epoxy molding compound (EMC).

Referring to FIG. 6J, by performing a grinding process or an etch-back process for the first molding part 51, one end of the first through electrodes 30 which are disposed on the first surfaces 10A of the first semiconductor chips 10 are exposed.

External connection terminals are mounted to the exposed one end of the first through electrodes 30. Then, by cutting the first and second molding parts 51 and 52 (i.e., individualizing semiconductor packages) using a diamond blade or a laser cutting apparatus, the stacked semiconductor package as shown in FIG. 1 is manufactured.

While, after exposing the one end of the first through electrodes 30, redistribution lines may be formed on the first molding part 51 to be electrically connected with the one end of the first through electrodes 30 exposed on the first molding part 51, and an insulation layer may be formed on the first molding part 51 including the redistribution lines to expose portions of the redistribution lines. Thereafter, external connection terminals may be mounted to the portions of the redistribution lines exposed through the insulation layer. Then, by cutting the first and second molding parts 51 and 52, the redistribution lines and the insulation layer using a diamond blade or a laser cutting apparatus, the stacked semiconductor package as shown in FIG. 2 is manufactured.

Alternately, after exposing the one end of the first through electrodes 30, by cutting the first and second molding parts 51 and 52, semiconductor packages may be individualized. Then, by mounting an individualized semiconductor package to a structural body such that the one end of the first through electrodes 30 exposed on the first molding part 51 may be electrically connected with connection electrodes of the structural body, the stacked semiconductor packages as shown in FIGS. 3 to 5 may be manufactured. The structural body may be any one of a printed circuit board (see FIG. 3), a semiconductor package (see FIG. 4) and an interposer (see FIG. 5).

Figure 7:
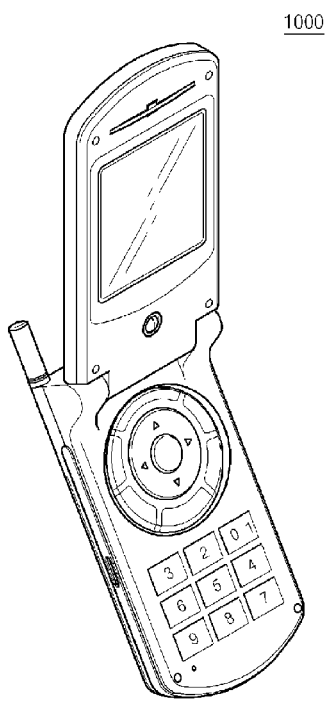
FIG. 7 is a perspective view illustrating an electronic apparatus having the stacked semiconductor package according to various embodiments.

FIG. 7 is a perspective view illustrating an electronic apparatus having the stacked semiconductor package according to the various embodiments.

Referring to FIG. 7, the stacked semiconductor package according to the various embodiments may be applied to an electronic apparatus 1000 such as a portable phone. Since the stacked semiconductor package according to the embodiments can prevent the occurrence of a fail, advantages are provided in improving the reliability of the electronic apparatus 1000. The electronic apparatus 1000 is not limited to the portable phone is shown in FIG. 7, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 8:
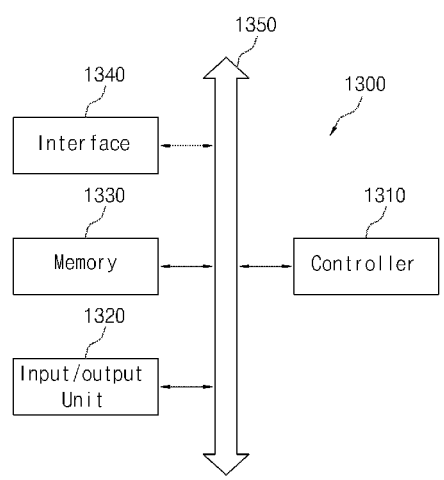
FIG. 8 is a block diagram showing an example of the electronic apparatus having the stacked semiconductor package according to various embodiments.

FIG. 8 is a block diagram showing an example of the electronic apparatus having the stacked semiconductor package according to the various embodiments.

Referring to FIG. 8, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the stacked semiconductor package according to the various embodiments. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile is memory device. Otherwise, the memory 1330 may be constituted by a flash memory. For example, a flash memory to which the technology of the embodiments is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

Although various embodiments have been described for illustrative purposes, those skilled in the art will appreciate that various modifications, additions, and substitutions are possible, without departing from the scope and the spirit of the invention as disclosed in the accompanying claims.

What is claimed is:

1. A stacked semiconductor package comprising:
   a first semiconductor chip having a first surface and a second surface which faces away from the first surface and including first bonding pads which are formed on the first surface and first through electrodes which pass through the first surface and the second surface;
   a second semiconductor chip stacked over the second surface of the first semiconductor chip, and including second bonding pads which are formed on a third surface facing the first semiconductor chip and second through electrodes which pass through the third surface and a fourth surface facing away from the third surface and are electrically connected with the first through electrodes; and a molding part formed to substantially cover the stacked first and second semiconductor chips and having openings which expose one end of the first through electrodes disposed on the first surface of the first semiconductor chip.

2. The stacked semiconductor package according to claim 1, wherein the molding part comprises:

a first molding part substantially covering the first surface of the first semiconductor chip and having the openings which expose the one end of the first through electrodes; and a second molding part formed to substantially cover the fourth surface of the second semiconductor chip and side surfaces of the first and second semiconductor chips.

3. The stacked semiconductor package according to claim 1, further comprising:

conductive connection members formed between the first through electrodes and the second through electrodes; and an adhesive member formed between the first semiconductor chip and the second semiconductor chip.

4. The stacked semiconductor package according to claim 1, further comprising:

anisotropic conductive material interposed between the first through electrodes and the second through electrodes and between the first semiconductor chip and the second semiconductor chip.

5. The stacked semiconductor package according to claim 1, further comprising:

external connection terminals mounted to the one end of the first through electrodes which are exposed through the molding part.

6. The stacked semiconductor package according to claim 1, further comprising:

redistribution lines formed over the molding part and electrically connected with the one end of the first through electrodes exposed through the molding part;

an insulation layer formed over the molding part including the redistribution lines and exposing portions of the redistribution lines; and external connection terminals mounted to the portions of the redistribution lines exposed through the insulation layer.

7. The stacked semiconductor package according to claim 1, further comprising:

a structural body having connection electrodes which are electrically connected with the one end of the first through electrodes exposed through the molding part.

8. The stacked semiconductor package according to claim 7, further comprising:

conductive connection members electrically connecting the one end of the first through electrodes with the connection electrodes.

9. The stacked semiconductor package according to claim 7, wherein the structural body comprises any one of a printed circuit board, an interposer, and a semiconductor package.

* * * * *